United States Patent
Park et al.

(10) Patent No.: US 9,172,054 B2
(45) Date of Patent: Oct. 27, 2015

(54) ORGANIC LIGHT EMITTING DISPLAY DEVICE

(71) Applicant: Samsung Display Co., Ltd., Yongin, Gyeonggi-do (KR)

(72) Inventors: Chan Young Park, Yongin (KR); Sung Jin Choi, Yongin (KR); Young Suk Cho, Yongin (KR); Ok Keun Song, Yongin (KR)

(73) Assignee: Samsung Display Co., Ltd. (KR)

( * ) Notice: Subject to any disclaimer, the term of this patent is extended or adjusted under 35 U.S.C. 154(b) by 72 days.

(21) Appl. No.: 14/101,605

(22) Filed: Dec. 10, 2013

(65) Prior Publication Data

US 2014/0183477 A1    Jul. 3, 2014

(30) Foreign Application Priority Data

Dec. 27, 2012  (KR) ........................ 10-2012-0155194

(51) Int. Cl.
*H01L 51/52* (2006.01)
*H01L 51/50* (2006.01)

(52) U.S. Cl.
CPC ........ *H01L 51/5036* (2013.01); *H01L 51/5218* (2013.01); *H01L 51/5231* (2013.01); *H01L 51/5265* (2013.01)

(58) Field of Classification Search
CPC .................................................. H01L 51/5203
See application file for complete search history.

(56) References Cited

U.S. PATENT DOCUMENTS

| | | | |
|---|---|---|---|
| 2004/0247936 A1* | 12/2004 | Nakashima et al. | 428/690 |
| 2005/0001963 A1* | 1/2005 | Yokoyama | 349/122 |
| 2006/0145159 A1* | 7/2006 | Yokoyama et al. | 257/72 |
| 2007/0228938 A1* | 10/2007 | Hatwar et al. | 313/504 |
| 2007/0295962 A1* | 12/2007 | Choi et al. | 257/59 |
| 2008/0180024 A1* | 7/2008 | Kwon | 313/504 |
| 2013/0193427 A1* | 8/2013 | Kurata et al. | 257/40 |

FOREIGN PATENT DOCUMENTS

| | | |
|---|---|---|
| KR | 10-2006-0038852 | 5/2006 |
| KR | 10-2010-0023756 | 3/2010 |
| KR | 10-2011-0007905 | 1/2011 |
| KR | 10-2011-0060474 | 6/2011 |

* cited by examiner

*Primary Examiner* — Lex Malsawma
(74) *Attorney, Agent, or Firm* — Knobbe Martens Olson & Bear LLP

(57) ABSTRACT

Provided is an organic light emitting display device. The organic light emitting display device comprises a substrate; a first electrode formed on the substrate and including a first sub-electrode and a second sub-electrode which have different reflectivities with respect to light wavelengths and are mutually stacked; an organic layer formed on the first electrode and including an organic light emitting layer; and a second electrode formed on the organic layer.

20 Claims, 3 Drawing Sheets

ORGANIC LIGHT EMITTING DISPLAY DEVICE

CROSS-REFERENCE TO RELATED APPLICATIONS

This application is based on and claims priority from Korean Patent Application No. 10-2012-0155194, filed on Dec. 27, 2012 in the Korean Intellectual Property Office, the disclosure of which is incorporated herein in its entirety by reference.

BACKGROUND

1. Field

The present disclosure relates to an organic light emitting display device which can emit lights having desired wavelengths, respectively, and thus can emit white light with high efficiency.

2. Description of the Related Technology

An organic light emitting display device is a self-luminous display device which emits light through application of a voltage to an organic light emitting layer that is interposed between a positive electrode and a negative electrode.

In such an organic light emitting display device, one of the positive electrode and the negative electrode is generally used as a reflection electrode and the other is used as a transparent electrode. Light emitted from the organic light emitting layer is generally provided in one direction.

For example, if a positive electrode that is used as a reflection electrode is formed on a substrate, an organic light emitting layer is formed on the positive electrode, and a negative electrode that is used as a transparent electrode is formed on the organic light emitting layer. Then, light emitted from the organic light emitting layer is provided in the direction of the negative electrode. An organic light emitting display device having such a structure is called a top-emission organic light emitting display device.

As another example, if a positive electrode that is used as a transparent electrode is formed on a substrate, an organic light emitting layer is formed on the positive electrode, and a negative electrode that is used as a reflection electrode is formed on the organic light emitting layer. Then, light emitted from the organic light emitting layer is provided in the direction of the positive electrode (or in the direction of the substrate). An organic light emitting display device having such a structure is called a bottom-emission organic light emitting display device.

When the positive electrode is used as a reflection electrode, it is typically formed of metal having high reflectivity.

SUMMARY OF CERTAIN INVENTIVE ASPECTS

According to an aspect of the present invention, there is provided an organic light emitting display device comprising: a substrate; a first electrode formed on the substrate and including a first sub-electrode and a second sub-electrode which have different reflectivities with respect to light wavelengths and are mutually stacked; an organic layer formed on the first electrode and including an organic light emitting layer; and a second electrode formed on the organic layer.

According to another aspect of the present invention, there is provided an organic light emitting display device comprising: a substrate; a first electrode including a first sub-electrode and a second sub-electrode which are sequentially stacked on the substrate; an organic layer formed on the first electrode and including an organic light emitting layer including a first light emitting layer that emits first light and a second light emitting layer that emits second light; and a second electrode formed on the organic layer, wherein the organic light emitting display device satisfies the following equations 1 and 2, $$0.9d1 \le d1 = \frac{m\lambda 1}{2n1\cos\theta 1} \le 1.1 d1 \quad \text{(Equation 1)}$$

$$0.9d2 \le d2 = \frac{t\lambda 2}{2n2\cos\theta 2} \le 1.1 d2 \quad \text{(Equation 2)}$$

where d1 denotes a distance between the second electrode and the first sub-electrode, d2 denotes a distance between the second electrode and the second sub-electrode, λ1 denotes an emission wavelength of first light, λ2 denotes an emission wavelength of second light, n1 denotes a refractive index of a medium between the second electrode and the first sub-electrode, n2 denotes a refractive index of a medium between the second electrode and the second sub-electrode, θ1 denotes an emission angle of the first light, θ2 denotes an emission angle of the second light, and m and t are natural numbers that are equal to or larger than 1.

According to the embodiments of the present invention, at least the following effects can be achieved.

According to the organic light emitting display device according to embodiments of the present invention, since the first electrode is configured by a plurality of sub-electrodes having different reflectivities with respect to light wavelengths, multiple resonance distances are formed between the first electrode and the second electrode, and the lights having desired wavelengths can be resonated and emitted.

Thus, according to the organic light emitting display device according to embodiments of the present invention, all the red light, the green light, and the blue light emitted from the red light emitting layer, the green light emitting layer, and the blue light emitting layer, respectively, which are included in the organic layer, can be strengthened, and thus the efficiency of the white light, in which the red light, the green light, and the blue light are mixed, emitted from the organic layer can be heightened. Further, according to the organic light emitting display device according to embodiments of the present invention, all the yellow light and the blue light emitted from the yellow light emitting layer and the blue light emitting layer, respectively, which are included in the organic layer, can be strengthened, and thus the efficiency of the white light, in which the yellow light and the blue light are mixed, emitted from the organic layer can be heightened.

The effects according to the present invention are not limited to the contents as exemplified above, but further various effects are included in the description.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF CERTAIN INVENTIVE EMBODIMENTS

Figure 1:
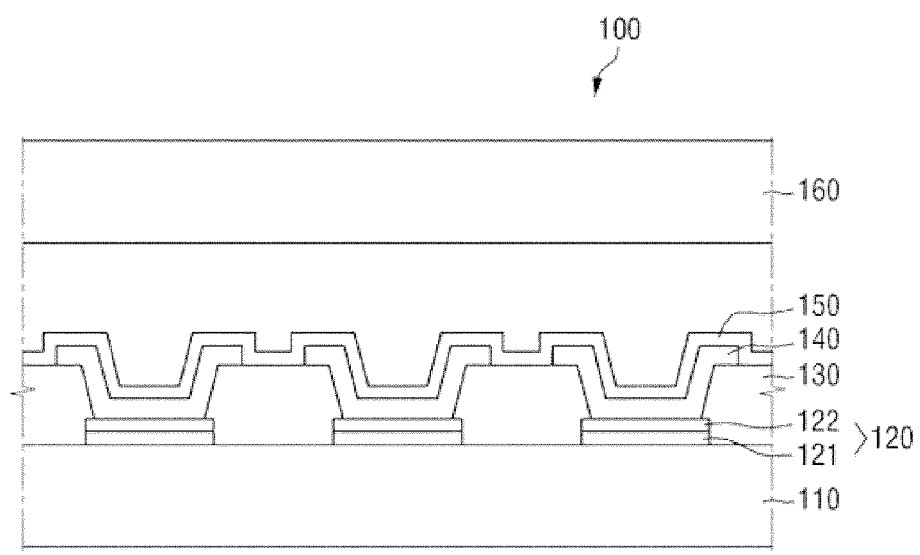
FIG. 1 is a cross-sectional view schematically illustrating an organic light emitting display device according to an embodiment of the present invention.

When using metal having high reflectivity as the positive electrode of an organic light emitting display device, a resonance effect occurs due to a distance between the positive electrode that is the reflection electrode and the negative electrode that is the transparent electrode, and by such a resonance effect, light having a specific wavelength may be strengthened and emitted.

However, in the case of a white organic light emitting display device in which an organic light emitting layer is configured by stacking a red light emitting layer that emits red light, a green light emitting layer that emits green light, and a blue light emitting layer that emits blue light to together emit white light, if a distance between opposite electrodes is determined, only light having a specific wavelength may be strengthened and emitted by the resonance effect of the wavelength that corresponds to the distance. That is, although the organic light emitting layer includes the red light emitting layer, the green light emitting layer, and the blue light emitting layer, only one color light is strengthened and emitted by the distance between the opposite electrodes, and thus a proper white light is unable to be obtained.

Accordingly, it is desirable to have an organic light emitting display device which can emit lights having desired wavelengths, respectively, and thus can emit white light with high efficiency.

Advantages and features of the present invention and methods of accomplishing the same may be understood more readily by reference to the following detailed description of certain embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

It will also be understood that when a layer is referred to as being "on" another layer or substrate, it can be directly on the other layer or substrate, or intervening layers may also be present. The same reference numbers generally indicate the same components throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Hereinafter, embodiments of the present invention will be described with reference to the accompanying drawings.

FIG. 1 is a cross-sectional view schematically illustrating an organic light emitting display device according to an embodiment of the present invention.

Referring to FIG. 1, an organic light emitting display device 100 according to an embodiment of the present invention includes a substrate 110, a first electrode 120, a pixel-defining film 130, an organic layer 140, and a second electrode 150.

The substrate 110 may include an insulating substrate. The insulating substrate may be formed of a transparent glass material having $SiO_2$ as a main component. In some embodiments, the insulating substrate may be made of an opaque material or a plastic material. Further, the insulating substrate may be a flexible substrate.

Although not illustrated, the substrate 110 may further include other structures formed on the insulating substrate. Examples of other structures may be a wiring, an electrode, an insulating film, and the like. In the case where the organic light emitting display device 100 is an active type organic light emitting display device, the substrate 110 may include a plurality of thin film transistors formed on the insulating substrate. A drain electrode of at least a part of the plurality of thin film transistors may be electrically connected to the first electrode 120. The thin film transistor may include an active region that is formed of silicon or oxide semiconductor.

The first electrode 120 is formed for each pixel on the substrate 110. The first electrode 120 may be an anode electrode which receives a signal that is applied to the drain electrode of the thin film transistor and provides holes to the organic layer 140, or a cathode electrode which receives the signal and provides electrons to the organic layer 140. In an embodiment of the present invention, the first electrode 120 is the anode electrode. In the case where the first electrode 120 is used as a reflection electrode, the organic light emitting display device 100 may be a top-surface organic light emitting display device in which light from the organic layer 140 is emitted in the direction of the second electrode 150. The detailed description of the first electrode 120 is provided below.

The pixel-defining film 130 is formed on the substrate 110 on which the first electrode 120 is formed. The pixel-defining film 130 is arranged on the boundary of pixels to discriminate the respective pixels. Further, the pixel-defining film 130 may define an opening for providing an arrangement space of the organic layer 140. By this opening of the pixel-defining film 130, the first electrode 120 is exposed, and a side portion of the first electrode 120 extends toward the pixel-defining film 130 to partially overlap the pixel-defining film 130. In a region where the pixel-defining film 130 overlaps the first electrode 120, the pixel-defining film 130 may be positioned on an upper portion of the first electrode 120 based on the substrate 110.

The pixel-defining film 130 may be made of an insulating material. The pixel-defining film 130 may be made of at least one organic material selected from the group including benzo cyclo butene (BCB), polyimide (PI), poly amaide (PA), acrylic resin, and phenol resin. In other embodiments, the pixel-defining film 130 may be made of an inorganic material such as silicon nitride.

The organic layer 140 is formed on the first electrode 120. The organic layer 140 may be formed on the opening of the pixel-defining film 130, and may extend to cover a part of the upper portion of the pixel-defining film 130. The organic layer 140 may include an organic light emitting layer that emits light through recombination of holes provided from the first electrode 120 and electrons provided from the second electrode 150. If holes and electrons are provided to the organic light emitting layer, they are recombined to form excitons, and the organic light emitting layer emits light as the excitons are shifted from an excited state to a ground state. The details of the organic light emitting layer of the organic layer 140 are provided below.

The organic layer 140 may further include a hole injection layer and a hole transport layer, which are formed between the first electrode 120 and the organic light emitting layer, in addition to the organic light emitting layer. The organic layer 140 may further include an electron injection layer and an electron transport layer, which are formed between the organic light emitting layer and the second electrode 150. If the first electrode 120 is a cathode electrode and the second electrode 150 is an anode electrode, the electron injection layer and the electron transport layer may be interposed between the first electrode 120 and the organic light emitting layer, and the hole injection layer and the hole transport layer may be interposed between the organic light emitting layer and the second electrode 150.

The second electrode 150 that is formed on the organic layer 140 may be a cathode electrode that provides electrons to the organic layer 140, or an anode electrode that provides holes to the organic layer 140. In an embodiment of the present invention, the second electrode 150 is a cathode electrode.

The organic light emitting display device 100 may further include a sealing substrate 160 that is disposed over the second electrode 150. The sealing substrate 160 may be an insulating substrate. A spacer (not illustrated) may be disposed between the second electrode 150 on the pixel-defining film 130 and the sealing substrate 160. In some embodiments, the sealing substrate 160 may be omitted. In this case, a sealing film that is made of an insulating material may cover the whole structure to protect the structure.

Hereinafter, the first electrode 120, the organic layer 140, and the second electrode 150 will be described in more detail. In one embodiment, the first electrode 120 and the second electrode 150 are configured so that the organic light emitting display device 100 is implemented by a top-surface organic light emitting display device.

Figure 2:
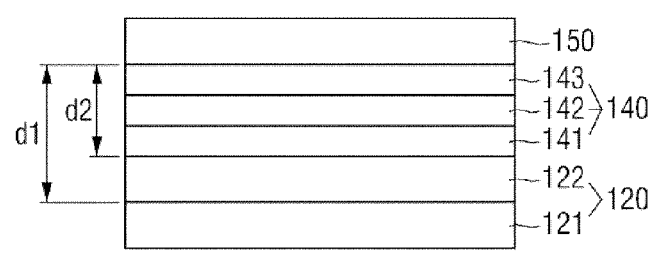
FIG. 2 is an enlarged cross-sectional view illustrating portions of a first electrode, an organic layer, and a second electrode in the organic light emitting display device of FIG. 1.
Figure 3:
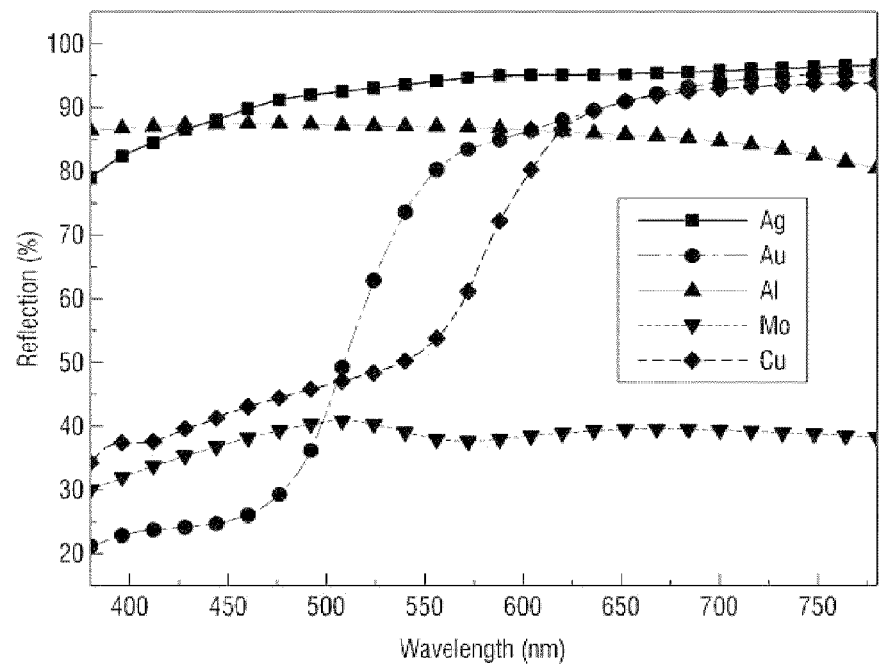
FIG. 3 is a graph illustrating reflectivity for each wavelength of a metal material.

FIG. 2 is an enlarged cross-sectional view illustrating portions of a first electrode, an organic layer, and a second electrode in the organic light emitting display device of FIG. 1, and FIG. 3 is a graph illustrating reflectivity for each wavelength of a metal material.

Referring to FIG. 2, the first electrode 120 includes a first sub-electrode 121 and a second sub-electrode 122 having different reflectivity with respect to light wavelengths. The first sub-electrode 121 and the second sub-electrode 122 may be mutually stacked. In the drawing, it is exemplified that the second sub-electrode 122 is stacked on the first sub-electrode 121. However, the stacking may be performed in reverse order.

The first sub-electrode 121 may come in contact with the substrate 110, and the second sub-electrode 122 may be interposed between the first sub-electrode 121 and the organic layer 140. The first sub-electrode 121 and the second sub-electrode 122 may be made of reflective conduction materials having different reflectivity with respect to light wavelengths emitted from the organic light emitting layer to be described below. In some embodiments of the present invention, the first sub-electrode 121 may be formed of any one selected from the group including aluminum (Al), silver (Ag), gold (Au), copper (Cu), and molybdenum (Mo), and the second sub-electrode 122 may be formed of another of the above-described metals.

The organic layer 140 includes an organic light emitting layer in which a red light emitting layer 141 that emits red light, a green light emitting layer 142 that emits green light, and a blue light emitting layer 143 that emits blue light are stacked. The organic layer 140 emits white light in which the red light, the green light, and the blue light are mixed. In the drawing, it is exemplified that the green light emitting layer 142 is stacked on the red light emitting layer 141, and the blue light emitting layer 143 is stacked on the green light emitting layer 142. However, the stacking order according to the present invention is not limited thereto.

The red light emitting layer 141 may include one red light emitting material, or may include a host and a red dopant. Examples of the host may be $Alq_3$, CBP(4,4'-N,N'-dicarbazol-biphenyl), PVK(ploy(n-vinylcarbaxol)), ADN(9,10-Di (naphthyl-2-yl)anthrace), TCTA(4,4',4''-tris(N-carbazolyl)-triphenylamine), TPBI(1,3,5-tris(N-phenylbenzimidazol-2-yl)benzene), TBADN(3-tert-butyl-9,10-di(naphth-2-yl) anthracene), E3(terfluorene), and DSA(distyrylarylene), but are not limited thereto. As the red dopant, PtOEP, $Ir(piq)_3$, or $Btp_2Ir(acac)$ may be used, but is not limited thereto.

The green light emitting layer 142 may include one green light emitting material, or may include a host and a green dopant. As the host of the green light emitting layer 142, the host of the red light emitting layer 141 may be used. Further, as the green dopant, $Ir(ppy)_3$, $Ir(ppy)_2(acac)$, or $Ir(mpyp)_3$ may be used, but is not limited thereto.

The blue light emitting layer 143 may include one blue light emitting material, or may include a host and a blue dopant. As the host of the blue light emitting layer 143, the host of the red light emitting layer 141 may be used. Further, as the blue dopant, $F_2Irpic$, $(F_2ppy)_2Ir(tmd)$, $Ir(dfppz)_3$, terfluorene, DPAVBi(4,4'-bis(4-diphenylaminostyryl) biphenyl), or TBPe(2,5,8,11-tetra-ti-butyl pherylene) may be used, but is not limited thereto.

The second electrode 150, which is a transparent electrode, may be formed of a transparent material, for example, ITO (indium-Tin-Oxide), IZO (Indium-Zinc-Oxide), or $In_2O_3$, or may be formed of a lamination film thereof.

In the case where the first electrode 120 is formed as the reflection electrode and the second electrode 150 is formed as the transparent electrode as described above, the first electrode 120 and the second electrode 150 serve as mirrors to make resonance effects occur. Since the first electrode 120 is configured to include the first sub-electrode 121 and the second sub-electrode 122 having different reflectivity with respect to the light wavelengths, the first sub-electrode 121 and the second sub-electrode 122 may form multiple resonance distances d1 and d2 between the first electrode 120 and the second electrode 150 and resonate and emit lights having desired wavelengths. For example, the first sub-electrode 121 may strengthen and emit the blue light emitted from the blue light emitting layer 143 by the resonance effect that occurs by the resonance distance d1, and the second sub-electrode 122 may strengthen and emit the red light and the green light emitted from the red light emitting layer 141 and the green light emitting layer 142 by the resonance effect that occurs by the resonance distance d2.

For this, the first sub-electrode 121 may be formed of a material of which the reflectivity with respect to the wavelength of the blue light is higher than the reflectivity with respect to the wavelengths of the red light and the green light, or a material of which the reflectivity with respect to all the wavelengths of the red light, the green light, and the blue light is equal to or higher than 70%. The wavelength of the red light is about 650 nm, the wavelength of the green light is about 550 nm, and the wavelength of the blue light is about 430 nm. Referring to FIG. 3, the first sub-electrode 121 may be formed of, for example, aluminum (Al) or silver (Ag).

The material, of which the reflectivity with respect to all the wavelengths of the red light, the green light, and the blue light is equal to or higher than 70%, is selected as the first sub-electrode 121. Otherwise, if the material, of which the reflectivity with respect to all the wavelengths of the red light, the green light, and the blue light is equal to or higher than 70%, is selected as the second sub-electrode 122 that is close to the organic layer 140, the lights emitted from the organic layer 140 are directly emitted to the second electrode 150 without the resonance effect, and thus the strength of the white light, in which the red light, the green light, and the blue light are mixed, is weakened.

The second sub-electrode 122 is formed of a material which has high reflectivity with respect to the wavelengths of the red light and the green light and low reflectivity with respect to the wavelength of the blue light. Referring to FIG. 3, the second sub-electrode 122 may be formed of gold (Au) or copper (Cu).

As described above, since the first sub-electrode 121 and the second sub-electrode 122 strengthen and emit all the red light, the green light, and the blue light from the red light emitting layer 141, the green light emitting layer 142, and the blue light emitting layer 143, the efficiency of the white light, in which the red light, the green light, and the blue light are mixed, emitted from the organic layer 140 can be heightened.

By contrast, if the first electrode 120 is formed as one reflection electrode having one reflectivity and the second electrode 150 is formed as the transparent electrode, one resonance distance is formed between the first electrode 120 and the second electrode 150, and by the resonance effect due to such one resonance distance, only the light having a specific wavelength is strengthened and emitted. In this case, all the red light, the green light, and the blue light from the red light emitting layer 141, the green light emitting layer 142, and the blue light emitting layer 143 included in the organic layer 140 are not strengthened and emitted, but only the light having the specific wavelength may be strengthened and emitted. Due to this, it is difficult to obtain proper white light from the organic layer 140.

On the other hand, it has been described that multiple resonance distances d1 and d2 are formed between the first electrode 120 and the second electrode 150 by the first sub-electrode 121 and the second sub-electrode 122, and in order to heighten the efficiency of the white light that is emitted from the organic layer 140 between the first electrode 120 and the second electrode 150, the conditions for the proper resonance distances d1 and d2 are given by the following equations 1 and 2. Hereinafter, the resonance distances d1 and d2 are classified into the first resonance distance d1 that indicates the distance between the second electrode 150 and the first sub-electrode 121, and the second resonance distance d2 that indicates the distance between the second electrode 150 and the second sub-electrode 122.

$$0.9d1 \leq d1 = \frac{m\lambda 1}{2n1\cos\theta 1} \leq 1.1d1 \quad \text{(Equation 1)}$$

In the equation 1, n1 denotes a refractive index of a medium between the second electrode 150 and the first sub-electrode 121, θ1 denotes an emission angle of the first light, λ1 denotes an emission wavelength of first light, and m is a natural number that is equal to or larger than 1. The first light may be any one of the red light, the green light, and the blue light.

$$0.9d2 \leq d2 = \frac{t\lambda 2}{2n2\cos\theta 2} \leq 1.1d2 \quad \text{(Equation 2)}$$

In the equation 2, n2 denotes a refractive index of a medium between the second electrode 150 and the second sub-electrode 122, θ2 denotes an emission angle of the second light, λ2 denotes an emission wavelength of second light, and t is a natural number that is equal to or larger than 1. The second light may be any one of the red light, the green light, and the blue light, except for the light selected as the first light.

As described above, according to the organic light emitting display device 100 according to an embodiment of the present invention, since the first electrode 120 includes the first sub-electrode 121 and the second sub-electrode 122 having different reflectivity with respect to the light wavelength, multiple resonance distances d1 and d2 are formed between the first electrode 120 and the second electrode 150, and the lights with the desired wavelengths can be resonated and emitted.

Accordingly, the organic light emitting display device 100 according to an embodiment of the present invention can strengthen and emit all the red light, the green light, and the blue light, which are respectively emitted from the red light emitting layer 141, the green light emitting layer 142, and the blue light emitting layer 143 included in the organic layer 140, and thus can heighten the efficiency of the white light, in which the red light, the green light, and the blue light are mixed, emitted from the organic layer 140.

Next, an organic light emitting display device according to another embodiment of the present invention will be described.

Figure 4:
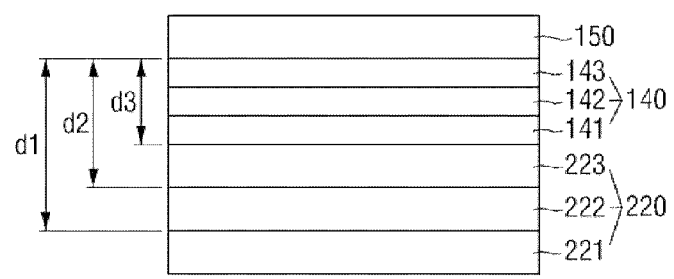
FIG. 4 is a cross-sectional view schematically illustrating an organic light emitting display device according to another embodiment of the present invention.

FIG. 4 is a cross-sectional view schematically illustrating an organic light emitting display device according to another embodiment of the present invention.

The organic light emitting display device according to this embodiment has the same configuration as the organic light emitting display device 100 of FIG. 2 except for the configuration of the first electrode 220. Accordingly, in describing the organic light emitting display device according to this embodiment, the first electrode 220 will be described primarily.

Referring to FIG. 4, the first electrode 220 includes a first sub-electrode 221, a second sub-electrode 222, and a third sub-electrode 223 having different reflectivity with respect to light wavelengths. The first sub-electrode 221, the second sub-electrode 222, and the third sub-electrode 223 may be mutually stacked. In the drawing, it is exemplified that the second sub-electrode 222 is stacked on the first sub-electrode 221 and the third sub-electrode 223 is stacked on the second sub-electrode 222. However, the stacking may be performed in other orders.

The first sub-electrode 221 may come in contact with the substrate 110, the second sub-electrode 222 may be interposed between the first sub-electrode 221 and the third sub-electrode 223, and the third sub-electrode 223 may be interposed between the second sub-electrode 222 and the organic layer 140. The first sub-electrode 221, the second sub-electrode 222, and the third sub-electrode 223 may be made of reflective conduction materials having different reflectivity with respect to light wavelengths emitted from the organic light emitting layer described below. In some embodiments of the present invention, the first sub-electrode 221 may be formed of any one selected from the group including aluminum (Al), silver (Ag), gold (Au), copper (Cu), and molybdenum (Mo), the second sub-electrode 222 may be formed of another of the above-described metals, and the third sub-electrode 223 may be formed of still another of the above-described metals.

In the case where the first electrode 220 is formed as the reflection electrode and the second electrode 150 is formed as the transparent electrode as described above, the first electrode 220 and the second electrode 150 serve as mirrors to make resonance effects occur. Since the first electrode 220 is configured to include the first sub-electrode 221, the second sub-electrode 222, and the third sub-electrode 223 having different reflectivity with respect to the light wavelengths, the first sub-electrode 221, the second sub-electrode 222, and the third sub-electrode 223 may form multiple resonance distances d1, d2, and d3 between the first electrode 220 and the second electrode 150 and resonate and emit lights having desired wavelengths. For example, the first sub-electrode 221 may strengthen and emit the blue light emitted from the blue light emitting layer 143 by the resonance effect that occurs by the resonance distance d1, the second sub-electrode 222 may strengthen and emit the green light emitted from the green light emitting layer 142 by the resonance effect that occurs by the resonance distance d2, and the third sub-electrode 223 may strengthen and emit the red light emitted from the red light emitting layer 141 by the resonance effect that occurs by the resonance distance d3.

For this, the first sub-electrode 221 may be formed of a material of which the reflectivity with respect to the wavelength of the blue light is higher than the reflectivity with respect to the wavelengths of the red light and the green light, or a material of which the reflectivity with respect to all the wavelengths of the red light, the green light, and the blue light is equal to or higher than 70%. The wavelength of the red light is about 650 nm, the wavelength of the green light is about 550 nm, and the wavelength of the blue light is about 430 nm. Referring to FIG. 3, the first sub-electrode 221 may be formed of, for example, aluminum (Al) or silver (Ag).

The second sub-electrode 222 is formed of a material which has high reflectivity with respect to the wavelength of the green light and low reflectivity with respect to the wavelength of the blue light. Referring to FIG. 3, the second sub-electrode 222 may be formed of, for example, gold (Au).

The third sub-electrode 223 is formed of a material which has high reflectivity with respect to the wavelength of the red light and low reflectivity with respect to the wavelengths of the blue light and the green light. Referring to FIG. 3, the third sub-electrode 223 may be formed of, for example, copper (Cu).

As described above, since the first sub-electrode 221, the second sub-electrode 222, and the third sub-electrode 223 strengthen and emit all the red light, the green light, and the blue light from the red light emitting layer 141, the green light emitting layer 142, and the blue light emitting layer 143, the efficiency of the white light, in which the red light, the green light, and the blue light are mixed, emitted from the organic layer 140 can be heightened.

Multiple resonance distances d1, d2, and d3 are formed between the first electrode 220 and the second electrode 150 by the first sub-electrode 221, the second sub-electrode 222, and the third sub-electrode 223 and in order to heighten the efficiency of the white light that is emitted from the organic layer 140 between the first electrode 220 and the second electrode 150, the conditions for the proper resonance distances d1, d2, and d3 are given by the following equation 3 in addition to the equations 1 and 2 as described above. Hereinafter, the resonance distances d1, d2, and d3 are classified into the first resonance distance d1 that indicates the distance between the second electrode 150 and the first sub-electrode 221, the second resonance distance d2 that indicates the distance between the second electrode 150 and the second sub-electrode 222, and the third resonance distance d3 that indicates the distance between the second electrode 150 and the third sub-electrode 223.

$$0.9d3 \le d3 = \frac{s\lambda 3}{2n3\cos\theta 3} \le 1.1d3 \qquad \text{(Equation 3)}$$

In the equation 3, n3 denotes a refractive index of a medium between the second electrode 150 and the third sub-electrode 223, θ3 denotes an emission angle of the third light, λ3 denotes an emission wavelength of the third light, and s is a natural number that is equal to or larger than 1. The third light may be any one of the red light, the green light, and the blue light, except for the lights selected as the first light and the second light.

As described above, according to the organic light emitting display device according to another embodiment of the present invention, since the first electrode 220 includes the first sub-electrode 221, the second sub-electrode 222, and the third sub-electrode 223 having different reflectivity with respect to the light wavelength, multiple resonance distances d1, d2, and d3 are formed between the first electrode 220 and the second electrode 150, and the lights with the desired wavelengths can be resonated and emitted.

Accordingly, the organic light emitting display device according to another embodiment of the present invention can strengthen and emit all the red light, the green light, and the blue light, which are respectively emitted from the red light emitting layer 141, the green light emitting layer 142, and the blue light emitting layer 143 included in the organic layer 140, and thus can heighten the efficiency of the white light, in which the red light, the green light, and the blue light are mixed, emitted from the organic layer 140.

Next, an organic light emitting display device according to still another embodiment of the present invention will be described.

Figure 5:
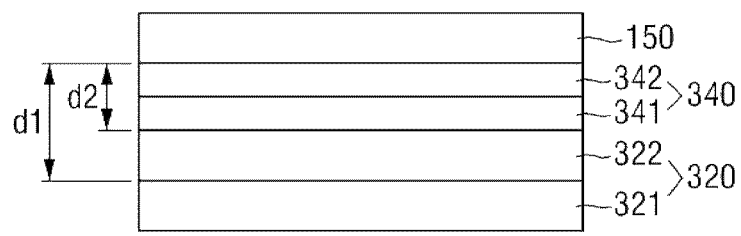
FIG. 5 is a cross-sectional view schematically illustrating an organic light emitting display device according to still another embodiment of the present invention.

FIG. 5 is a cross-sectional view schematically illustrating an organic light emitting display device according to still another embodiment of the present invention.

The organic light emitting display device according to this embodiment has the same configuration as the organic light emitting display device 100 of FIG. 2 except for the configuration of a first electrode 320 and an organic layer 340. Accordingly, in describing the organic light emitting display device according to this embodiment, the first electrode 320 and the organic layer 340 will be described primarily.

Referring to FIG. 5, the first electrode 320 includes a first sub-electrode 321 and a second sub-electrode 322 having different reflectivity with respect to light wavelengths. The first sub-electrode 321 and the second sub-electrode 322 may be mutually stacked. In the drawing, it is exemplified that the second sub-electrode 322 is stacked on the first sub-electrode 321. However, the stacking may be performed in reverse order.

The first sub-electrode 321 may come in contact with the substrate 110, and the second sub-electrode 322 may be interposed between the first sub-electrode 321 and the organic layer 340. The first sub-electrode 321 and the second sub-electrode 322 may be made of reflective conduction materials having different reflectivity with respect to light wavelengths emitted from the organic light emitting layer to be described later. In some embodiments of the present invention, the first sub-electrode 321 may be formed of any one selected from the group including aluminum (Al), silver (Ag), gold (Au), copper (Cu), and molybdenum (Mo), and the second sub-electrode 322 may be formed of another of the above-described metals.

Specifically, the organic layer 340 includes an organic light emitting layer in which a yellow light emitting layer 341 that emits yellow light, and a blue light emitting layer 342 that emits blue light are stacked. The organic layer 340 emits white light in which the yellow light and the blue light are mixed. In the drawing, it is exemplified that the blue light emitting layer 342 is stacked on the yellow light emitting layer 341. However, the stacking order according to the present invention is not limited thereto.

The yellow light emitting layer 341 may include one yellow light emitting material, or may include a host and a yellow dopant. Examples of the host may be $Alq_3$, CBP(4,4'-N,N'-dicarbazol-biphenyl), PVK(ploy(n-vinylcarbaxol)), ADN(9,10-Di(naphthyl-2-yl)anthrace), TCTA(4,4',4"-tris (N-carbazolyl)-triphenylamine), TPBI(1,3,5-tris(N-phenyl-benzimidazol-2-yl)benzene), TB ADN(3-tert-butyl-9,10-di (naphth-2-yl) anthracene), E3(terfluorene), and DSA (distyrylarylene), but are not limited thereto. As the yellow dopant, rubrene or the like may be used, but is not limited thereto.

Since the blue light emitting layer 342 is made of the same material as the blue light emitting layer 143, the duplicate description thereof will be omitted.

In the case where the first electrode 320 is formed as the reflection electrode and the second electrode 150 is formed as the transparent electrode as described above, the first electrode 320 and the second electrode 150 serve as mirrors to make resonance effects occur. Since the first electrode 320 is configured to include the first sub-electrode 321 and the second sub-electrode 322 having different reflectivity with respect to the light wavelengths, the first sub-electrode 321 and the second sub-electrode 322 may form multiple resonance distances d1 and d2 between the first electrode 320 and the second electrode 150 and resonate and emit lights having desired wavelengths. For example, the first sub-electrode 321 may strengthen and emit the blue light emitted from the blue light emitting layer 342 by the resonance effect that occurs by the resonance distance d1, and the second sub-electrode 322 may strengthen and emit the yellow light emitted from the yellow light emitting layer 341 by the resonance effect that occurs by the resonance distance d2.

For this, the first sub-electrode 321 may be formed of a material of which the reflectivity with respect to the wavelength of the blue light is higher than the reflectivity with respect to the wavelength of the yellow light, or a material of which the reflectivity with respect to all the wavelengths of the yellow light and the blue light is equal to or higher than 70%. The wavelength of the yellow light is about 580 nm and the wavelength of the blue light is about 430 nm. Referring to FIG. 3, the first sub-electrode 321 may be formed of, for example, aluminum (Al) or silver (Ag).

The second sub-electrode 322 is formed of a material which has high reflectivity with respect to the wavelength of the yellow light and low reflectivity with respect to the wavelength of the blue light. Referring to FIG. 3, the second sub-electrode 322 may be formed of, for example, gold (Au) or copper (Cu).

As described above, since the first sub-electrode 321 and the second sub-electrode 322 strengthen and emit all the yellow light and the blue light from the yellow light emitting layer 341 and the blue light emitting layer 342, the efficiency of the white light, in which the yellow light and the blue light are mixed, emitted from the organic layer 340 can be heightened.

Multiple resonance distances d1 and d2 are formed between the first electrode 320 and the second electrode 150 by the first sub-electrode 321 and the second sub-electrode 322, and in order to heighten the efficiency of the white light that is emitted from the organic layer 340 between the first electrode 320 and the second electrode 150, the conditions for the proper resonance distances d1 and d2 are given by the equations 1 and 2 as described above. However, the first light is any one of the yellow light and the green light in the equation 1, and the second light is any one of the yellow light and the green light except for the light selected as the first light.

As described above, according to the organic light emitting display device according to still another embodiment of the present invention, since the first electrode 320 includes the first sub-electrode 321 and the second sub-electrode 322 having different reflectivity with respect to the light wavelengths, multiple resonance distances d1 and d2 can be formed between the first electrode 320 and the second electrode 150, and the lights with the desired wavelengths can be resonated and emitted.

Accordingly, the organic light emitting display device according to still another embodiment of the present invention can strengthen and emit all the yellow light and the blue light, which are respectively emitted from the yellow light emitting layer 341 and the blue light emitting layer 342 included in the organic layer 340, and thus can heighten the efficiency of the white light, in which the yellow light and the blue light are mixed, emitted from the organic layer 340.

In concluding the detailed description, those skilled in the art will appreciate that many variations and modifications can be made to the embodiments without substantially departing from the principles of the present invention. Therefore, the disclosed embodiments of the invention are used in a generic and descriptive sense only and not for purposes of limitation.

What is claimed is:

1. An organic light emitting display device comprising:
a substrate;
a first electrode formed on the substrate and including a first sub-electrode, a second sub-electrode which have different reflectivities with respect to light wavelengths and are mutually stacked;
an organic layer formed on the first electrode and including an organic light emitting layer; and
a second electrode formed on the organic layer,
wherein the organic light emitting layer comprises a stacking of:
a first light emitting layer emitting a first light, and
a second light emitting layer emitting a second light,
wherein the first sub-electrode comprises a material of which a reflectivity with respect to a wavelength of the first light is higher than a reflectivity with respect to a wavelength of the second light, and
wherein the second sub-electrode comprises a material which has high reflectivity with respect to the wavelength of the second light and low reflectivity with respect to the wavelength of the first light.

2. The organic light emitting display device of claim 1, wherein the wavelength of the first light is smaller than the wavelength of the second light, wherein the first sub-electrode is formed to be in contact with the substrate, and the second sub-electrode is formed between the first sub-electrode and the organic layer, and wherein the organic light emitting layer further comprises a third light emitting layer emitting a third light.

3. The organic light emitting display device of claim 2, wherein the first sub-electrode is formed of a material of which reflectivity with respect to a wavelength of the first light is higher than reflectivity with respect to wavelengths of the second light and the third light, or a material of which reflectivity with respect to all the wavelengths of the first light, the second light, and the third light is equal to or higher than 70%.

4. The organic light emitting display device of claim 3, wherein the first sub-electrode is formed of aluminum (Al) or silver (Ag).

5. The organic light emitting display device of claim 2, wherein the second sub-electrode is formed of a material which has high reflectivity with respect to the wavelengths of the second light and the third light and low reflectivity with respect to the wavelength of the first light.

6. The organic light emitting display device of claim 5, wherein the second sub-electrode is formed of gold (Au) or copper (Cu).

7. The organic light emitting display device of claim 2, wherein the first electrode further comprises a third sub-electrode that is formed between the second sub-electrode and the organic layer, and
wherein the third sub-electrode has reflectivity with respect to the light wavelength that is different from the reflectivity with respect to the light wavelengths of the first sub-electrode and the second sub-electrode.

8. The organic light emitting display device of claim 7, wherein the first sub-electrode is formed of a material of which reflectivity with respect to a wavelength of the first light is higher than reflectivity with respect to wavelengths of the second light and the third light, or a material of which reflectivity with respect to all the wavelengths of the first light, the second light, and the third light is equal to or higher than 70%.

9. The organic light emitting display device of claim 8, wherein the first sub-electrode is formed of aluminum (Al) or silver (Ag).

10. The organic light emitting display device of claim 7, wherein the second sub-electrode is formed of a material which has high reflectivity with respect to the wavelength of the third light and low reflectivity with respect to the wavelength of the first light.

11. The organic light emitting display device of claim 10, wherein the second sub-electrode is formed of gold (Au).

12. The organic light emitting display device of claim 7, wherein the third sub-electrode is formed of a material which has high reflectivity with respect to the wavelength of the second light and low reflectivity with respect to the wavelengths of the first light and the third light.

13. The organic light emitting display device of claim 12, wherein the third sub-electrode is formed of copper (Cu).

14. The organic light emitting display device of claim 1, wherein the second electrode is formed of a conductive material.

15. An organic light emitting display device of claim 1, comprising:
wherein the wavelength of the first light is smaller than the wavelength of the second light, and
wherein the first sub-electrode is formed to be in contact with the substrate, and the second sub-electrode is formed between the first sub-electrode and the organic layer.

16. The organic light emitting display device of claim 15, wherein the first sub-electrode is formed of a material of which reflectivity with respect to a wavelength of the first light is higher than reflectivity with respect to a wavelength of the second light, or a material of which reflectivity with respect to all the wavelengths of the first light and the second light is equal to or higher than 70%.

17. The organic light emitting display device of claim 15, wherein the second sub-electrode is formed of a material which has high reflectivity with respect to the wavelength of the second light and low reflectivity with respect to the wavelength of the first light.

18. An organic light emitting display device comprising:
a substrate;
a first electrode including a first sub-electrode and a second sub-electrode which are sequentially stacked on the substrate;
an organic layer formed on the first electrode and including an organic light emitting layer including a first light emitting layer that emits first light, and a second light emitting layer that emits second light; and
a second electrode formed on the organic layer,
wherein the organic light emitting display device satisfies the following equations 1 and 2, $$0.9d1 \leq d1 = \frac{m\lambda 1}{2n1\cos\theta 1} \leq 1.1d1 \quad \text{(Equation 1)}$$

$$0.9d2 \leq d2 = \frac{t\lambda 2}{2n2\cos\theta 2} \leq 1.1d2 \quad \text{(Equation 2)}$$

where d1 denotes a distance between the second electrode and the first sub-electrode, d2 denotes a distance between the second electrode and the second sub-electrode, $\lambda 1$ denotes an emission wavelength of first light, $\lambda 2$ denotes an emission wavelength of second light, n1 denotes a refractive index of a medium between the second electrode and the first sub-electrode, n2 denotes a refractive index of a medium between the second electrode and the second sub-electrode, $\theta 1$ denotes an emission angle of the first light, $\theta 2$ denotes an emission angle of the second light, and m and t are natural numbers that are equal to or larger than 1.

19. The organic light emitting display device of claim 18, wherein the first light is any one of red light, green light, and blue light, and the second light is any one of the red light, the green light, and the blue light, except for the light selected as the first light, or
the first light is any one of yellow light and blue light, and the second light is any one of the yellow light and the blue light except for the light selected as the first light.

20. The organic light emitting display device of claim 18, wherein the first electrode further includes a third sub-electrode that is interposed between the second sub-electrode and the organic layer,
wherein the organic light emitting layer further includes a third light emitting layer that emits third light, and
wherein the organic light emitting display device satisfies the equation 3, $$0.9d3 \leq d3 = \frac{s\lambda 3}{2n3\cos\theta 3} \leq 1.1d3 \quad \text{(Equation 3)}$$

where d3 denotes a distance between the second electrode and the third sub-electrode, $\lambda 3$ denotes an emission wavelength of the third light, n3 denotes a refractive index of a medium between the second electrode and the third sub-electrode, θ3 denotes an emission angle of the third light, and s is a natural number that is equal to or larger than 1.

* * * * *